(12) United States Patent
Wong et al.

(10) Patent No.: US 7,013,229 B2
(45) Date of Patent: Mar. 14, 2006

(54) OBTAINING CALIBRATION PARAMETERS FOR A THREE-PORT DEVICE UNDER TEST

(75) Inventors: Kenneth H. Wong, Santa Rosa, CA (US); James C. Liu, Santa Rosa, CA (US); Johan J. Ericsson, Windsor, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 169 days.

(21) Appl. No.: 10/712,645

(22) Filed: Nov. 13, 2003

(65) Prior Publication Data

US 2005/0107972 A1 May 19, 2005

(51) Int. Cl.
*G01R 35/00* (2006.01)

(52) U.S. Cl. .......................................... 702/107; 702/85
(58) Field of Classification Search .................. 73/1.01, 73/432.1, 865.9, 866.1; 324/601, 602, 605, 324/612, 638, 642, 646; 342/642, 646, 165, 342/174; 702/85, 90, 107, 108, 117, 118
See application file for complete search history.

(56) References Cited

U.S. PATENT DOCUMENTS

| | | | |
|---|---|---|---|
| 5,434,511 A | | 7/1995 | Adamian et al. |
| 5,467,021 A | * | 11/1995 | Adamian et al. ........... 324/601 |
| 5,537,046 A | * | 7/1996 | Adamian et al. ........... 324/601 |

(Continued)

OTHER PUBLICATIONS

Boehm, J; Albright, W; "Unconditionalstability of a Three-Port Network Characterized with S–Parameters"; IEEE Transactions on Microwave Theory and Techniques; vol. MTT–35 No. 6; Jun. 1987; pp582–586.*

Schoon, M; "A Semi–Automatic 3–Port Network Analyzer"; IEEE Transactions on Microwave Theory and Techniques; vol. 41 No. 6/7; Jun./Jul. 1993; pp 974–978.*

Ghannouchi, F; "A Calibration and Measurement Method of a Tri–Six–Port Network Analyzer Suitable for On–Wafer Characterization of Three–Port Devices"; IEEE Transactions on Instrumentation and Measurement; vol. 42 No. 4; Aug. 1993; pp 864–866.*

Selmi, L; Estreich, D; "An Accurate System for Automated On–Wafer Characterization of Three–Port Devices"; Technical Digest Gallium Arsenide Integrated Circuit Symposium; 12th annual Oct. 7–10, 1990; pp 343–346.*

Engen, G; Adamian, V; "Applications of a Multi–State Termination to Microwave Metrology"; Conference on Precision Electromagnetic Measurements Digest; Jun. 27–Jul. 1, 1994; pp 292–293.*

A. Ferrero, et al. "Two–Port Network Analyzer Calibration Using an Unknown 'Thru'", *IEEE Microwave and Guided Wave Letter*, vol. 2, No. 12, Dec. 1992, pp. 505–507.

S. Goldberg, et al. "Accurate Experimental Characterization of Three–Ports", *IEEE MTT–S Digest*, 1991, pp. 241–244.

M. Davidovitz, "Reconstruction of the S–Matrix for a 3–Pot Using Measurements at Only Two Ports", *IEEE Microwave and Guided Wave Letters*, vol. 5, No. 10, Oct. 1995, pp. 349–350.

*Primary Examiner*—Bryan Bui
*Assistant Examiner*—Douglas N Washburn

(57) ABSTRACT

Calibration is performed for the testing of a device under test. A first port of the device under test is connected to a port of a calibration module. A second port of the device under test is connected to a first port of a device tester. A third port of the device under test is connected to a second port of a device tester. The device tester performs measurements by the device tester to obtain calibration parameters. In response to commands from the device tester, the calibration module changes termination values at the port of the calibration module. The changing of the termination values is performed without physical disconnection of the port of the calibration module from the first port of the device under test.

20 Claims, 6 Drawing Sheets

U.S. PATENT DOCUMENTS

| | | | |
|---|---|---|---|
| 5,548,221 A * | 8/1996 | Adamian et al. | 324/601 |
| 5,548,538 A | 8/1996 | Grace et al. | |
| 5,552,714 A * | 9/1996 | Adamian et al. | 324/601 |
| 5,578,932 A * | 11/1996 | Adamian | 324/601 |
| 5,587,934 A | 12/1996 | Oldfield et al. | |
| 5,661,404 A | 8/1997 | Yanagawa et al. | |
| 6,333,931 B1 * | 12/2001 | LaPier et al. | 370/385 |
| 6,417,674 B1 * | 7/2002 | Rowell et al. | 324/601 |
| 6,421,624 B1 * | 7/2002 | Nakayama et al. | 702/117 |
| 6,614,237 B1 * | 9/2003 | Ademian et al. | 324/601 |
| 6,653,848 B1 * | 11/2003 | Adamian et al. | 324/638 |
| 6,744,262 B1 * | 6/2004 | Adamian | 324/638 |
| 6,757,625 B1 * | 6/2004 | Adamian et al. | 702/57 |
| 6,826,506 B1 * | 11/2004 | Adamian et al. | 702/118 |
| 6,853,198 B1 * | 2/2005 | Boudiaf et al. | 324/601 |

* cited by examiner

OBTAINING CALIBRATION PARAMETERS FOR A THREE-PORT DEVICE UNDER TEST

BACKGROUND

The present invention concerns network analyzers and pertains particularly to obtaining calibration parameters for a three-port device under test.

A network analyzer typically integrates a synthesized signal source with built-in signal separation devices, receivers, a display and a processor.

Measurement calibration is a process that characterizes the systematic errors of a network analyzer. This information can be used to improve measurement accuracy by using error correction arrays during signal processing to compensate for systematic measurement errors. Measurement calibration is also called Cal, a short form of calibration. Error correction is also called accuracy enhancement. Measurement errors are classified as random and systematic errors. Random errors, such as noise and connector repeatability are non-repeatable and not correctable by measurement calibration and error correction.

Systematic errors, such as tracking and crosstalk, are the most significant errors in most network analyzer measurements. Systematic errors are repeatable and for the most part correctable, though small residual errors may remain. These systematic errors may drift with time and temperature and therefore require new measurement calibrations to maintain error corrected measurement accuracy.

Systematic errors are due to system frequency response, isolation between the signal paths, and mismatch in the test setup. Frequency response errors (transmission and reflection tracking) result from the difference of the test signal path and receiver with respect to the reference signal path and receiver that are a function of frequency.

Isolation errors result from energy leakage between signal paths in measurements. This leakage is due to crosstalk. In reflection measurements, the leakage is also due to imperfect directivity. Directivity is the ability of the signal separation devices to separate forward traveling signals from reverse traveling signals.

Mismatch errors result from differences between the port impedance of the device under test (DUT) and the port impedance of the network analyzer. Source match errors are produced on the source (network analyzer OUT) side of the DUT. Load match errors are produced on the load (network analyzer IN) side. If the DUT is not connected directly to the ports, the mismatch errors due to cables, adapters, etc. are considered part of the source or load match errors.

The network analyzer has several methods of measuring and compensating for these test system errors. Each method removes one or more of the systematic errors using equations derived from an error model. Measurement of high quality standards (for example, short, open, load, through) allows the network analyzer to solve for the error terms in the error model. The accuracy of the calibrated measurements is dependent on the quality of the standards used and the stability of the measurement system. Since calibration standards are very precise, great accuracy can be achieved.

To perform a transmission calibration, at least four measurement standards are utilized: for example, an open, a short, a load, and a through cable. The network analyzer measures each standard across a defined frequency band using a pre-defined number of points. The measurement of these standards is used to solve for the error terms in the error model and to remove systematic errors caused by transmission frequency response, load match and source match.

To perform a reflection calibration, a one-port calibration is performed using at least three measurement standards, such as an open, a short, and a load. The network analyzer measures each standard across a predefined frequency band using a pre-defined number of points. The measurements of these standards are used to solve for the error terms in the error model and to remove systematic errors caused by directivity, source match and reflection frequency response.

For further information about calibration of network analyzers, see for example, the *HP 8712C and HP 8714C RF Network Analyzer User's Guide,* Part No. 08712-90056, October, 1996, pp. 6-1 through 6-14, available from Agilent Technologies, Inc.

In order to reduce the time required for calibration various systems have incorporated some automated features. For example U.S. Pat. No. 5,434,511, U.S. Pat. No. 5,467,021, U.S. Pat. No. 5,537,046, U.S. Pat. No. 5,548,221, U.S. Pat. No. 5,552,714 and U.S. Pat. No. 5,578,932 discuss electronic calibration accessories that perform computer-assisted calibrations with electronic standards, making the calibration process less time-consuming and error-prone. When using these electronic calibration accessories it is necessary to manually connect a module to the measurement ports. U.S. Pat. No. 5,587,934 also sets out an electronic calibration module that uses manual connections. U.S. Pat. No. 5,548,538 discloses a technique for including calibrations internal to the network analyzer.

When measuring a three-port device using a two-port network analyzer, the device needs to be measured three times. Typically, it has been necessary to move cables in order to accommodate a port orientation to the device that is different for each calibration measurement. Because test port cable characteristics change with cable movements, calibration accuracy is reduced. A vector network analyzer (VNA) two-port calibration method known as "unknown through" calibration is used to minimize cable movement and connections during calibration of a three-port device. See, for example, A. Ferrero., "Two-Port Network Analyzer Calibration Using an Unknown "Thru"", IEEE Microwave and Guided Wave Letter, Vol. 2, No. 12, December 1992. pp. 505–507. Using this method, the test port cables can be positioned to align with the desired measurement ports of the three-port device. The test port connectors are configured to mate with the measurement ports of the three-port device. Then, the appropriate one-port calibration standards are connected to each test port and measured. A calibration module may be used to reduce the number of connections. The three-port device is then connected between the test ports as the "unknown thru" with the third port terminated by a load or equivalent, to complete the VNA calibration.

A minimum of three different terminations is connected to the third port to obtain the data required to extract the three-port S-parameters. Three different known standards may be used; however, this disconnection and reconnection is time consuming and connection and disconnection of terminations may lead to differences in measurement that are not repeatable.

SUMMARY OF THE INVENTION

Calibration is performed for the testing of a device under test. A first port of the device under test is connected to a port of a calibration module. A second port of the device under test is connected to a first port of a device tester. A third port of the device under test is connected to a second port of a device tester. The device tester performs measurements by the device tester to obtain calibration parameters. In response to commands from the device tester, the calibration module changes termination values at the port of the calibration module. The changing of the termination values is performed without physical disconnection of the port of the calibration module from the first port of the device under test.

DETAILED DESCRIPTION OF EMBODIMENTS OF THE INVENTION

Figure 1:
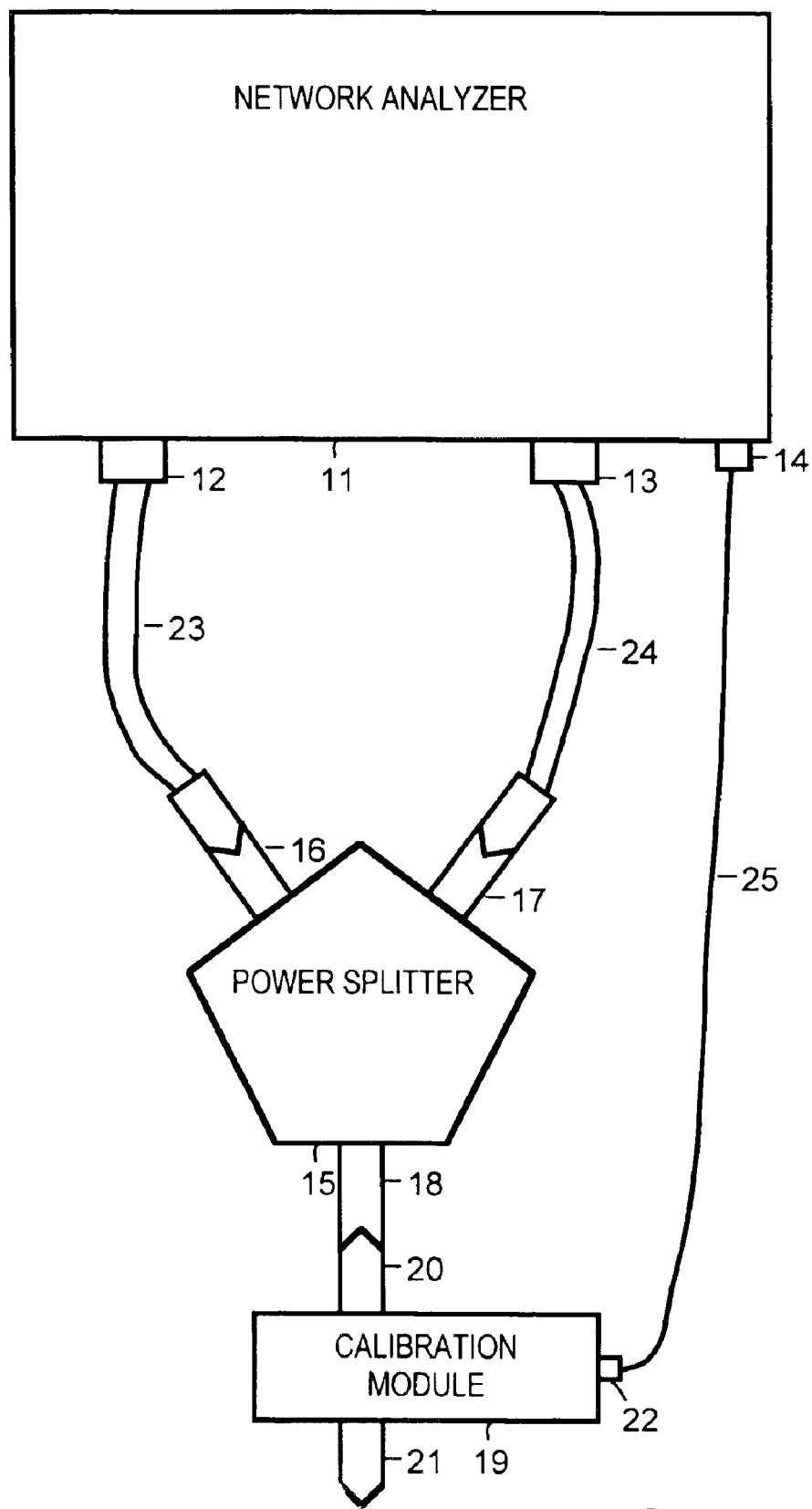
FIG. 1 is a simplified block diagram showing configuration of a network analyzer and a calibration module used to test a three-port device in accordance with an embodiment of the present invention.

FIG. 1 is a simplified block diagram showing a network analyzer 11 and a calibration module 19 configured to perform tests on a power splitter 15. Network analyzer 11 is, for example a radio frequency (RF) or microwave vector network analyzer (VNA).

A first port 20 of calibration module 19 is connected to a first port 18 of power splitter 15. A second port 21 of calibration module 19 is not connected. A USB port 22 of calibration module 19 is connected to a USB port 14 of network analyzer 11 by a USB cable 25. The USB connection is used for communication between calibration module 19 and network analyzer 11. Alternatively, calibration module 19 and network analyzer 11 can communicate using any of the many available types of wire, optical and/or wireless connections.

A one-port calibration is performed on a first port 12 (port one) of network analyzer 11. Another one-port calibration is performed on a second port 13 (port 2) of network analyzer 11. These one-port calibrations may be perform using electronic calibration modules, mechanical calibration standards or in-line calibration pods.

First port 12 (port one) of network analyzer 11 is connected to a second port 16 (port two) of power splitter 15 by a cable 23. Second port 13 (port two) of network analyzer 11 is connected to a third port 17 (port three) of power splitter 15 by a cable 24.

Figure 2:
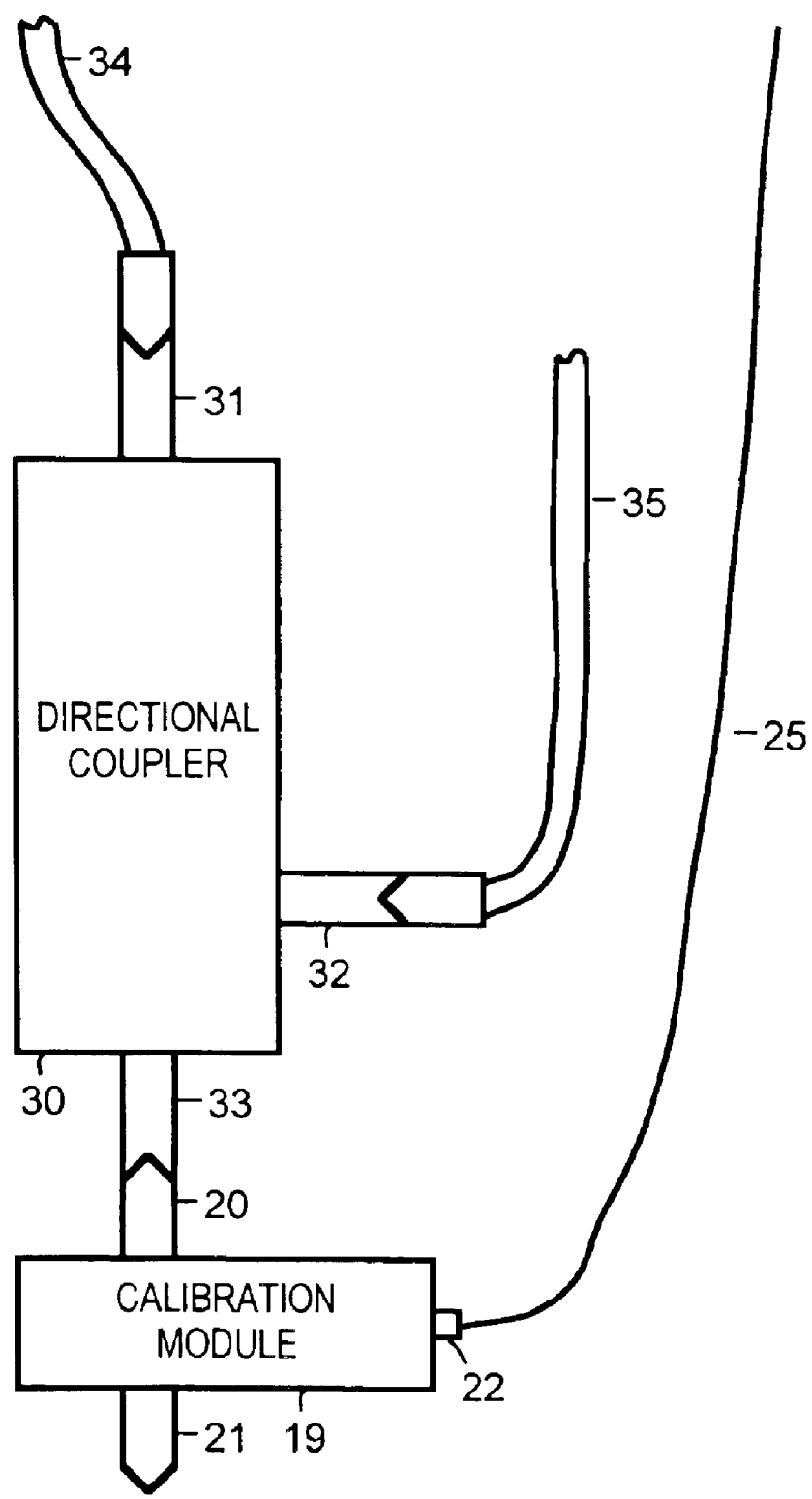
FIG. 2 is a simplified block diagram showing configuration of a network analyzer and a calibration module used to test another three-port device in accordance with an embodiment of the present invention.

While FIG. 1 shows network analyzer connected to a power splitter 15, various embodiments of the invention can be used to test other types of three-port device. For example, FIG. 2 shows configuration of a directional coupler 30 for testing. First port 20 of calibration module 19 is connected to a first port 33 of directional coupler 30. Second port 21 of calibration module 19 is not connected. USB port 22 of calibration module 19 is connected to a USB port of a network analyzer (not shown) by a USB cable 25. A first port of the network analyzer is connected to a second port 31 of directional coupler 30 by a cable 34. A second port of the network analyzer is connected to a third port 32 of directional coupler 30 by a cable 35.

In addition to power splitters and directional couplers, embodiments of the present invention are useful for other types of three-port devices. For example, the calibration techniques described herein are applicable for other three-port devices that are passive and reciprocal, where forward transmission equals reverse transmission (S21=S12, S32=S23, etc.).

Figure 3:
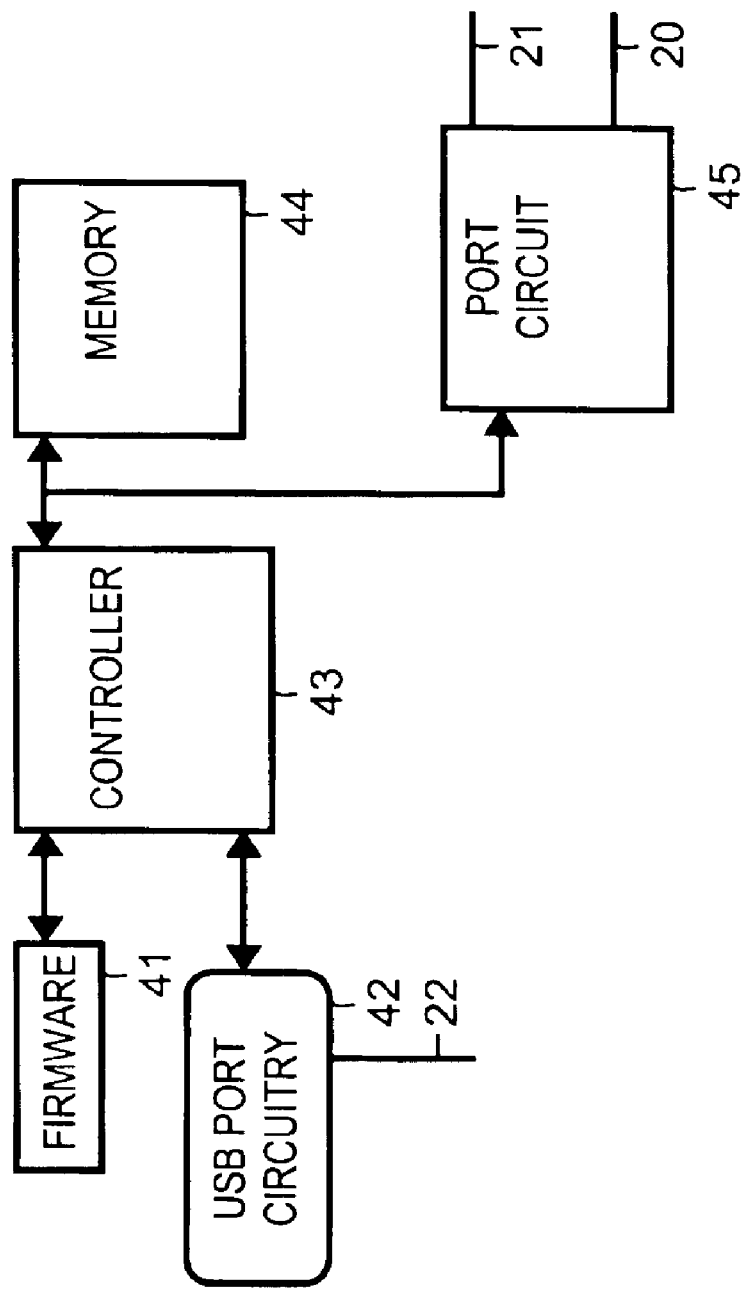
FIG. 3 is a simplified block diagram of a calibration module in accordance with an embodiment of the present invention.

FIG. 3 is a simplified block diagram of calibration module 19. USB port circuitry 42 is used to interact with USB port 22. Port circuit 45 is used to provide different calibration standards (and thus terminations) to port 20 and port 21. A controller 43 utilizing firmware 41 and memory 44 responds to commands received over USB port 22. In response to controller 43, port circuit 45 can vary the calibration standards on port 20 and on port 21. For more information on calibration modules, see, for example, U.S. Pat. No. 5,434,511 and U.S. Pat. No. 5,548,221.

During testing of a three-port device (e.g., either power splitter 15 shown in FIG. 1 or directional coupler 30 shown in FIG. 2) calibration module 19, in response to commands received from network analyzer 11 received over USB cable 25, places three known and dissimilar calibration standards on first port 20. For each calibration standard, network analyzer 11 takes a set of S-parameter measurements. This is sufficient for network analyzer 11 to calculate S-parameters for the three-port device.

Figure 4:
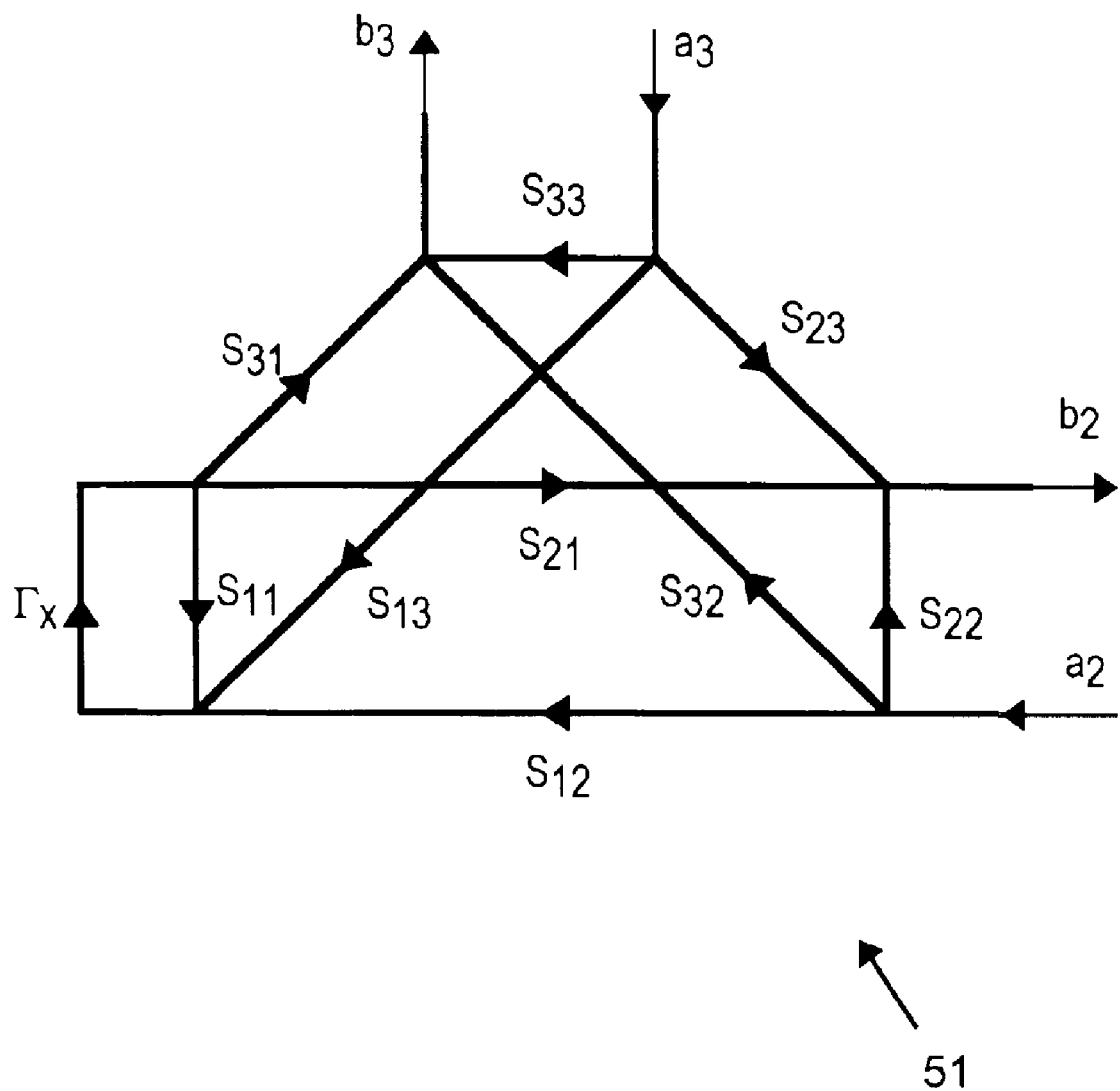
FIG. 4 shows S-parameters for a three-port device with a connected termination.

FIG. 4 shows a signal flow graph representation 51 for a passive three-port device such as power splitter 15 or directional coupler 30. On the first port of the three-port device (connected to first port 20 of calibration module 19), a calibration standard ($\Gamma_x$) is provided by calibration module 19. Calibration standard ($\Gamma_x$) provides a termination x to the first port of the three-port device. $S_{11}$ represents the reflective signal from the first port of the three-port device to the first port of the three-port device. $S_{21}$ represents the transmission signal from the first port of the three-port device to the second port of the three-port device. $S_{31}$ represents the transmission signal from the first port of the three-port device to the third port of the three-port device. $S_{12}$ represents the transmission signal from the second port of the three-port device to the first port of the three-port device. $S_{22}$ represents the reflective signal from the second port of the three-port device to the second port of the three-port device. $S_{32}$ represents the transmission signal from the second port of the three-port device to the third port of the three-port device. $S_{13}$ represents the transmission signal from the third port of the three-port device to the first port of the three-port device. $S_{23}$ represents the transmission signal from the third port of the three-port device to the second port of the three-port device. $S_{33}$ represents the reflective signal from the third port of the three-port device to the third port of the three-port device.

The discussion below illustrates how all S-parameters can be calculated for a passive three-port device.

For each calibration standard ($\Gamma_x$) of calibration module 19 that provides a termination x to the first port of the three-port device, network analyzer 11 is able to measure reflective and transmission values $S_{11mx}, S_{21mx}, S_{12mx}, S_{22mx}$ relative to the ports of network analyzer. For each termination x, these measured reflective and transmission values can be defined as set out in Equations 1 below:

Equations 1

$S_{11mx}$=measured $S_{11}$ with termination x $S_{21mx}$=measured $S_{21}$ with termination x $S_{12mx}$=measured $S_{12}$ with termination x $S_{22mx}$=measured $S_{22}$ with termination x When network analyzer 11 is measuring values for $S_{11mx}$, $S_{21mx}$, $S_{12mx}$, $S_{22mx}$, network analyzer 11 is measuring these values relative to its own port one and port two. However, as seen from FIG. 1, for example, first port 12 (port one) of network analyzer 11 is connected to second port 16 (port two) of power splitter 15. Second port 13 (port two) of network analyzer 11 is connected to third port 17 (port three) of power splitter 15. Thus, port one of network analyzer 11 is connected to port two of power splitter 15. Likewise, port two of network analyzer 11 is connected to port three of power splitter 15. So, when network analyzer 11 measures values, the network analyzer measured value of $S_{11mx}$ is actually related to $S_{22}$ of the three-port device, the network analyzer measured value of $S_{21mx}$ is actually related to $S_{32}$ of the three-port device, the network analyzer measured value of $S_{12mx}$ is actually related to $S_{23}$ of the three-port device, and the network analyzer measured value of $S_{22mx}$ is actually related to $S_{33}$ of the three-port device.

For power splitter 15, first port 18 (port one) is the input port and the remaining two ports of power splitter 15 are the output ports. For directional coupler 30, first port 3 (port one) is the output port and the remaining two ports of directional coupler 30 are the coupled ports. It is recommended that the through path of network analyzer 11 be the path with the highest loss.

From FIG. 4, and the definitions of the measured values for $S_{11mx}$, $S_{21mx}$, $S_{12mx}$, $S_{22mx}$, it is clear that the following relationships set out in Equations 2 are true.

$$S_{11mx} = S_{22} + S_{12}S_{21}\left(\frac{\Gamma_x}{1-S_{11}\Gamma_x}\right)$$ Equation 2

$$S_{21mx} = S_{32} + S_{12}S_{31}\left(\frac{\Gamma_x}{1-S_{11}\Gamma_x}\right)$$

$$S_{12mx} = S_{23} + S_{13}S_{21}\left(\frac{\Gamma_x}{1-S_{11}\Gamma_x}\right)$$

$$S_{22mx} = S_{33} + S_{13}S_{31}\left(\frac{\Gamma_x}{1-S_{11}\Gamma_x}\right)$$

For each termination x, three independent equations can be obtained. The number of unknowns is reduced to six by requiring the following necessary conditions: $S_{21}=S_{12}$, $S_{13}=S_{31}$, and $S_{23}=S_{32}$. This would imply that measurements for only two standards are necessary to obtain values for the six unknowns.

However, each equation is a bilinear transformation. Because the term $S_{11}$ is common to all the equations, two sets of measurements will yield only four unique equations to solve for six unknowns. Also, for best results, it is more accurate to extract small values from measurements of small values and large values from measurements of large values. The reflection terms $S_{11}$, $S_{22}$ and $S_{33}$ are best derived from load measurement data. The transmission terms are best derived from open and short measurement data. Redundant information can be used to obtain a better estimate of the calculated results.

The measured parameters $S_{21mx}$ and $S_{12mx}$ may differ slightly due to measurement errors. To minimize errors, the measured parameters $S_{21mx}$ and $S_{12mx}$ can be averaged and relabeled $S_{21vx}$ where $S_{21vx}=(S_{21mx}+S_{12mx})/2$.

When the calibration standard ($\Gamma_x$) of calibration module 19 that provides a termination x to the first port of the three-port device is an open, this is denoted by x=o. When the calibration standard ($\Gamma_x$) of calibration module 19 that provides a termination x to the first port of the three-port device is a short, this is denoted by x=s. When the calibration standard ($\Gamma_x$) of calibration module 19 that provides a termination x to the first port of the three-port device is a load (termination), this is denoted by x=t. Using this terminology $G_t$, $G_s$ and $G_o$ are defined as follows in Equations 3:

$$G_t = \frac{\Gamma_t}{1-S_{11}\Gamma_t}$$ Equation 3

$$G_s = \frac{\Gamma_s}{1-S_{11}\Gamma_s}$$

$$G_o = \frac{\Gamma_o}{1-S_{11}\Gamma_o}$$

From Equations 2, Equations 3 and the given definitions, Equation 4 can be derived.

Equations 4

$$S_{11mt}-S_{11ms}=S_{21}S_{12}(G_t-G_s)$$

$$S_{11ms}-S_{11mo}=S_{21}S_{12}(G_s-G_o)$$

$$S_{21vt}-S_{21vs}=S_{12}S_{31}(G_t-G_s)$$

$$S_{21vs}-S_{21vo}=S_{12}S_{31}(G_s-G_o)$$

$$S_{22mt}-S_{22ms}=S_{31}S_{13}(G_t-G_s)$$

$$S_{22ms}-S_{22mo}=S_{31}S_{13}(G_s-G_o)$$

As can be seen from Equations 4, there exist multiple solutions for the same parameter. This is illustrated, for example, by Equation 5 below:

$$\frac{S_{ijmt}-S_{ijms}}{S_{ijms}-S_{ijmo}} = \frac{G_t-G_s}{G_s-G_o}$$ Equation 5

$i, j = 1, 2$

There are several possible solutions for $S_{11}$. Since $S_{11}$ is required to derive the other S parameters, it is desired to get as accurate a result for $S_{11}$ as possible. Averaging at least two of the derived values for $S_{11}$ may provide a better estimate of the actual value. However, for devices like directional couplers, the reverse coupling path loss is so much higher than the other paths that the measurements may be too noisy to be used for averaging. It is best to use solutions for $S_{11}$ that are similar in magnitude when performing averaging. Obtaining an average value for $S_{11}$ is illustrated by Equation 6, Equations 7 and Equation 8 below:

$$\frac{G_t-G_s}{G_s-G_o} = \frac{\left(\frac{\Gamma_t}{1-S_{11}\Gamma_t}\right)-\left(\frac{\Gamma_s}{1-S_{11}\Gamma_s}\right)}{\left(\frac{\Gamma_s}{1-S_{11}\Gamma_s}\right)-\left(\frac{\Gamma_o}{1-S_{11}\Gamma_o}\right)}$$ Equation 6

$$= \frac{(\Gamma_t-\Gamma_s)(1-\Gamma_o S_{11})}{(\Gamma_s-\Gamma_o)(1-\Gamma_t S_{11})}$$

Equations 7 obtains the average value $(\overline{S_{11}})$ for $S_{11}$ using $\Psi_{ij}$ as defined below and substituting equation (6) into equation 5.

$$\Psi_{ij} = \left(\frac{S_{ijmt} - S_{ijms}}{S_{ijms} - S_{ijmo}}\right)\left(\frac{\Gamma_s - \Gamma_o}{\Gamma_t - \Gamma_s}\right) \quad \text{Equation 7}$$

$$S_{11} = \frac{1 - \Psi_{ij}}{\Gamma_o - \Psi_{ij}\Gamma_t}$$

$$\overline{S_{11}} = \frac{1}{2}\left[\left(\frac{1 - \Psi_{11}}{\Gamma_o - \Psi_{11}\Gamma_t}\right) + \left(\frac{1 - \Psi_{22}}{\Gamma_o - \Psi_{22}\Gamma_t}\right)\right] \text{ or}$$

$$\overline{S_{11}} = \frac{1}{2}\left[\left(\frac{1 - \Psi_{11}}{\Gamma_o - \Psi_{11}\Gamma_t}\right) + \left(\frac{1 - \Psi_{21}}{\Gamma_o - \Psi_{21}\Gamma_t}\right)\right] \text{ etc.}$$

For directional couplers, $$\frac{S_{21}}{S_{31}}$$

is the coupling term with respect to the output port. For power splitters, $$\frac{S_{21}}{S_{31}}$$

is the output tracking term.

Values for $$\frac{S_{21}}{S_{31}}$$

can be calculated as set out in equation 8.

$$\frac{S_{11ms} - S_{11mo}}{S_{21vs} - S_{21vo}} = \frac{S_{21}}{S_{31}} = \frac{S_{21vs} - S_{21vo}}{S_{22ms} - S_{22mo}} \quad \text{Equation 8}$$

Values for $S_{21}$ (and thus $S_{12}$), and $S_{31}$ (and thus $S_{13}$) can be calculated as set out in Equations 9 below. The correct phase for $S_{21}$ and $S_{31}$ can be determined by an estimate of the electrical length of the device, and the projected DC intercept value. For passive reciprocal devices, the forward and reverse transmission terms are always equal.

$$S_{21}S_{12} = S_{21}^2 = \frac{S_{11ms} - S_{11mo}}{\overline{G_s} - \overline{G_o}} \quad \text{Equation 9}$$

$$S_{12}S_{31} = \frac{S_{21vs} - S_{21vo}}{\overline{G_s} - \overline{G_o}}$$

$$S_{31}S_{13} = S_{31}^2 = \frac{S_{22ms} - S_{22mo}}{\overline{G_s} - \overline{G_o}}$$

where $$(\overline{G_s} - \overline{G_o}) = \frac{\Gamma_s - \Gamma_o}{(1 - \overline{S_{11}}G_s)(1 - \overline{S_{11}}G_o)}$$

Values for $S_{22}$, $S_{32}$ and $S_{33}$ can be calculated as set out in Equations 10 below:

$$S_{22} = S_{11mt} - S_{12}S_{21}\overline{G_t} \quad \text{Equations 10}$$

$$S_{32} = S_{21vs} - S_{12}S_{31}\overline{G_s}$$

$$S_{33} = S_{22mt} - S_{13}S_{31}\overline{G_t}$$

Figure 5:
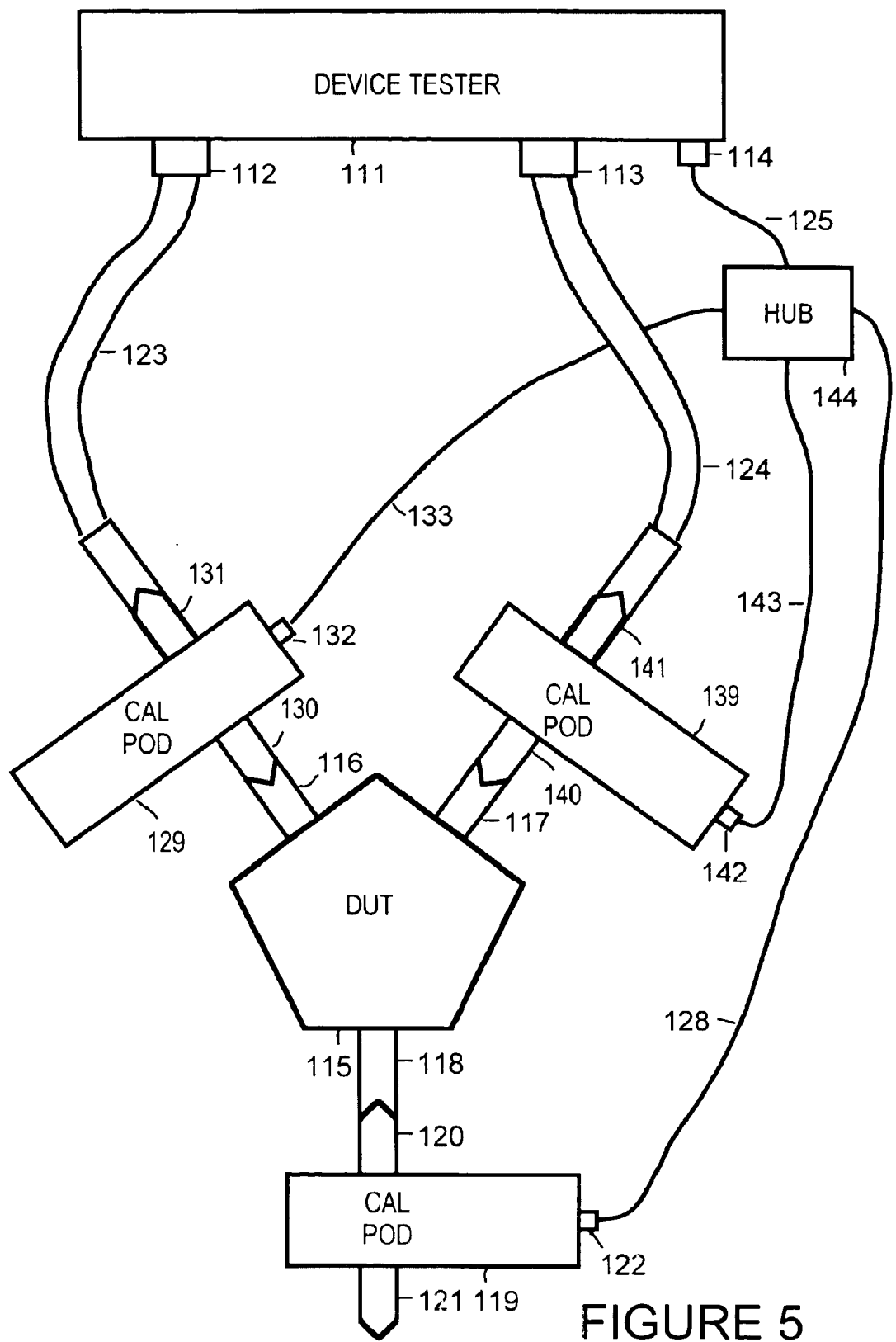
FIG. 5 is a simplified block diagram showing configuration of a device tester and calibration pods used to test another three-port device in accordance with another embodiment of the present invention.

-continued where $\overline{G_t} = \frac{\Gamma_t}{(1 - \overline{S_{11}}\Gamma_t)}; \overline{G_s} = \frac{\Gamma_s}{(1 - \overline{S_{11}}\Gamma_s)}$ Equations 11 below show conversions of the calculated s-parameters to device specific terminologies:

Couplers: Equations 11 directivity (dB) = $20 \log_{10}\left(\frac{S_{31}}{S_{32}}\right)$ coupling factor (dB)$_{input\ port}$ = $20 \log_{10}(S_{32})$ coupling factor (dB)$_{output\ port}$ = $20 \log_{10}\left(\frac{S_{32}}{S_{21}}\right)$ through path loss (insertion loss) = $20 \log_{10}(S_{21})$ input return loss = $20 \log_{10}(S_{22})$ output return loss = $20 \log_{10}(S_{11})$ couple port return loss = $20 \log_{10}(S_{33})$ Power Splitter:

input return loss = $20 \log_{10}(S_{11})$ insertion loss (dB) = $20 \log_{10}(S_{21})$ or
$20 \log_{10}(S_{31})$ output tracking (dB) = $20 \log_{10}\left(\frac{S_{31}}{S_{21}}\right)$ equivalent source match port 2 (dB) = $20 \log_{10}\left(S_{22} - \frac{S_{21}S_{32}}{S_{31}}\right)$ equivalent source match port 3 (dB) = $20 \log_{10}\left(S_{33} - \frac{S_{31}S_{23}}{S_{21}}\right)$ FIG. 5 is a simplified block diagram showing a device tester 111, a calibration (cal) pod 119, a calibration (cal) pod 129 and a calibration (cal) pod 139 configured to perform tests on a device under test (DUT) 115. Device tester 111 is, for example a radio frequency (RF) network analyzer or microwave vector network analyzer (VNA).

A first port 120 of calibration pod 119 is connected to a first port 118 of DUT 115. A second port 121 of calibration pod 119 is not connected. A USB port 122 of calibration pod 119 is connected to a USB hub 144 by a cable 128. USB hub 144 is also connected to a USB port 114 of device tester 111 by a USB cable 125.

A first port 130 of a calibration pod 129 is connected to a second port 116 of DUT 115. A second port 131 of calibration pod 129 is connected through a cable 123 to a first port 112 (port one) of device tester 111. A USB port 132 of calibration pod 129 is connected to USB hub 144 by a cable 133.

A first port 140 of a calibration pod 139 is connected to a third port 117 of DUT 115. A second port 141 of calibration pod 139 is connected through a cable 124 to a second port 113 (port two) of device tester 111. A USB port 142 of calibration pod 139 is connected to USB hub 144 by a cable 143.

The USB protocol is used for communication between calibration pods 119, 129, 139 and device tester 111. Alternatively, any of the many available types of wire, optical and/or wireless connection protocols can be used for communication.

Calibration pod 129 performs a one-port calibration on first port 112 (port one) of device tester 111. Calibration pod 139 performs a one-port calibration on second port 113 (port 2) of device tester 111. When the one-port calibrations are completed, through paths for calibration pod 129 and calibration pod 139 are turned on and calibration is transformed to the mating planes of DUT 115 with calibration pod 129 and calibration pod 139.

Calibration pod 119 is set to an impedance termination state. The through path of DUT 115 from second port 116 to third port 117 is measured. Then an "unknown through" calibration is employed (as described above) to obtain full two-port error correction terms for DUT 115 between second port 116 and third port 117. As discussed above, three sets of error corrected two-port measurements are made for DUT 115. Each set consist of a different impedance setting at port 118 of DUT 115, as provided by calibration pod 119. From the three sets of error corrected two-port measurements, the three-port S-parameters of DUT 115 are calculated as described above.

Figure 6:
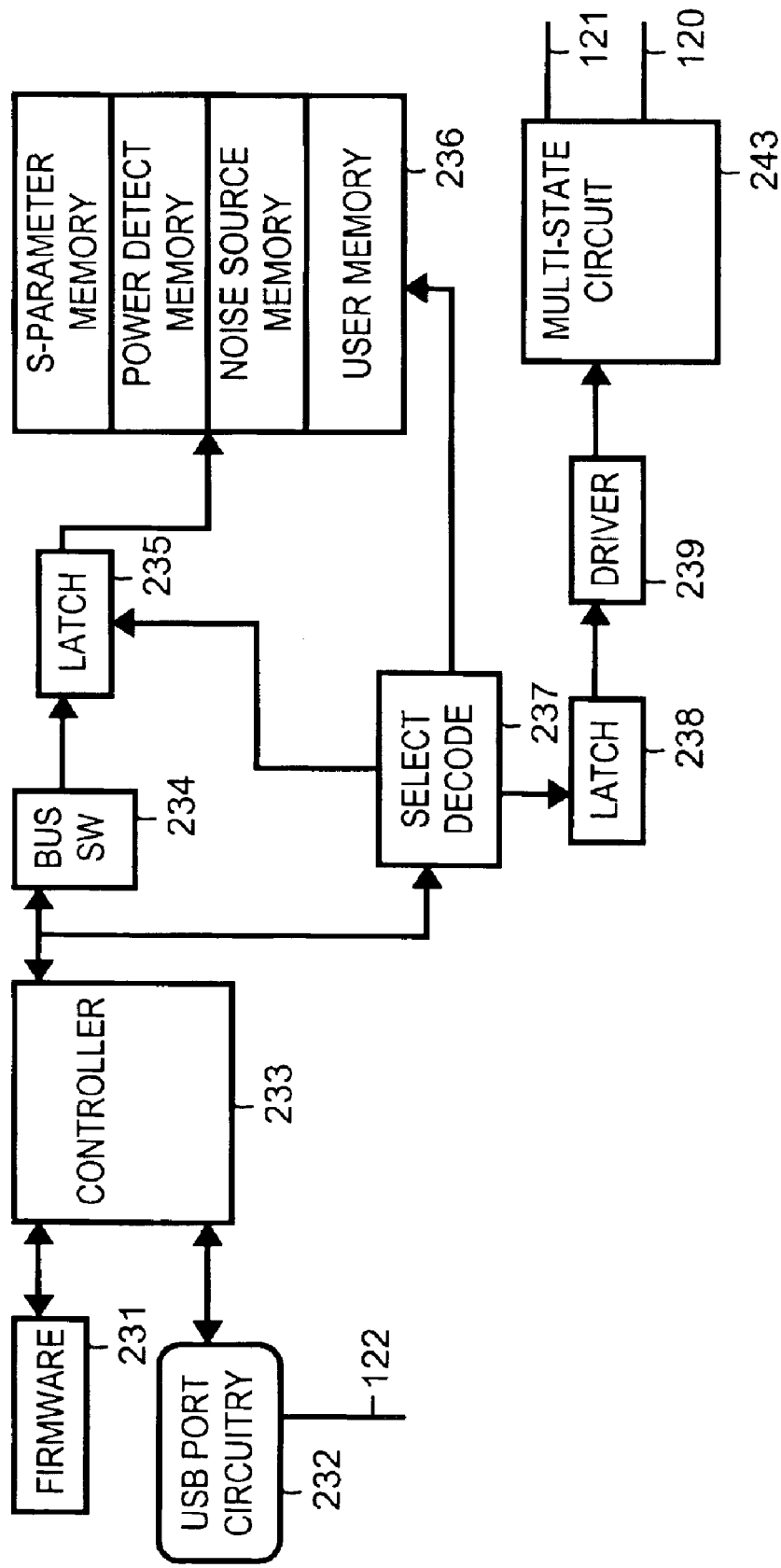
FIG. 6 is a simplified block diagram of a calibration pod.

FIG. 6 is a simplified block diagram of calibration pod 119. Calibration pod 129 and calibration pod 139 are, for example, equivalent in design.

A microcontroller 233 communicates with device tester 111 through USB port circuitry 232 connected to USB port 122. Programming for controller 233 is stored as firmware 231. A memory 236 includes s-parameter memory, power detect memory, noise source memory and user memory. The s-parameter memory stores a characterization of calibration pod 119, which calibration module 119 makes available to device tester 111 when calibration pod 119 is connected to device tester 111. The power detect memory is used to optionally store power characterization values for calibration pod 119. The noise source memory is used to optionally store noise source characterization values for calibration pod 119. User memory can be utilized by the user of the system to store characterization values that can be used in addition to or in place of the values in the s-parameter memory, the power detect memory and the noise source memory.

For example, memory 236 is composed of flash memory. Alternatively, memory 236 is composed of another type of computer readable non-volatile memory (e.g., read only memory, programmable ROM, EPROM, EEPROM, etc.) or computer readable volatile memory (e.g., random access memory, static RAM, dynamic, RAM, etc.).

A data path from controller 233 to memory 236 travels through a bus switch (SW) 234 and a latch 235. Control and address signals are generated by select decode 237 via instructions from controller 233. Select decode 237 provides instruction through latch 238 and driver 239 to a multi-state circuit 243. Multi-state circuit 243 is connected to port 120 and port 121 of calibration pod 119. Multi-state circuit 243 controls placement of open, short, through, and load calibration standards on port 120 and port 121.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for performing calibration for testing of a device under test, the method comprising:

connecting a first port of the device under test to a port of a calibration module;

connecting a second port of the device under test to a first port of a device tester;

connecting a third port of the device under test to a second port of a device tester; and, performing measurements by the device tester to obtain calibration parameters, including:

changing, by the calibration module, termination values at the port of the calibration module in response to commands from the device tester, the changing of the termination values being performed without physical disconnection of the port of the calibration module from the first port of the device under test and without connecting the first port of the device under test to the device tester.

2. A method as in claim 1 additionally comprising:

performing a one-port calibration of the first port of the device tester; and, performing a one-port calibration of the second port of the device tester.

3. A method as in claim 1 wherein:

the device under test is a power splitter;

the first port of the device under test is an input port of the power splitter; and, the second port and the third port of the device under test are output ports of the power splitter.

4. A method as in claim 1 wherein the device under test is one of the following:

a power splitter;

a directional coupler.

5. A method as in claim 1 wherein:

the device under test is a directional coupler;

the first port of the device under test is an output port of the directional coupler; and, the second port and the third port of the device under test are coupled ports of the directional coupler.

6. A method as in claim 1 wherein the calibration parameters are three-port S-parameters.

7. A method as in claim 1 wherein the calibration parameters are the following three-port S-parameters:

$S_{11}$ representing a reflective signal from the first port of the device under test to the first port of the device under test;

$S_{21}$ representing the transmission signal from the first port of the device under test to the second port of the device under test;

$S_{31}$ representing the transmission signal from the first port of the device under test to the third port of the device under test;

$S_{12}$ representing the transmission signal from the second port of the device under test to the first port of the device under test;

$S_{22}$ representing the reflective signal from the second port of the device under test to the second port of the device under test;

$S_{32}$ representing the transmission signal from the second port of the device under test to the third port of the device under test;

$S_{13}$ representing the transmission signal from the third port of the device under test to the first port of the device under test;

$S_{23}$ representing the transmission signal from the third port of the device under test to the second port of the device under test; and, $S_{33}$ representing the reflective signal from the third port of the device under test to the third port of the device under test;

wherein $S_{21}=S_{12}$, $S_{13}=S_{31}$, and $S_{23}=S_{32}$.

8. A method as in claim 1 wherein the device tester is a network analyzer.

9. A device tester that tests a device under test, the device tester comprising:

a first port;

a second port; and, a communication port;

wherein the device tester communicates to a calibration module through the communication port, instructing the calibration module to change termination values at a port of the calibration module without physical disconnection of the port of the calibration module from a first port of the device under test, the instructing being given during testing of the device under test when a second port of the device under test is connected to the first port of the device tester, when a third port of the device under test is connected to the second port of the device tester, and when the device tester is obtaining calibration parameters for the device under test.

10. A device tester as in claim 9 wherein the device under test is a power splitter.

11. A device tester as in claim 9 wherein:

the device under test is a power splitter;

the first port of the device under test is an input port of the power splitter; and, the second port and the third port of the device under test are output ports of the power splitter.

12. A device tester as in claim 9 wherein the device under test is a directional coupler.

13. A device tester as in claim 9 wherein:

the device under test is a directional coupler;

the first port of the device under test is an output port of the directional coupler; and, the second port and the third port of the device under test are coupled ports of the directional coupler.

14. A device tester as in claim 9 wherein the calibration parameters are three-port S-parameters.

15. A device tester as in claim 9 wherein the calibration parameters are the following three-port S-parameters:

$S_{11}$ representing a reflective signal from the first port of the device under test to the first port of the device under test;

$S_{21}$ representing the transmission signal from the first port of the device under test to the second port of the device under test;

$S_{31}$ representing the transmission signal from the first port of the device under test to the third port of the device under test;

$S_{12}$ representing the transmission signal from the second port of the device under test to the first port of the device under test;

$S_{22}$ representing the reflective signal from the second port of the device under test to the second port of the device under test;

$S_{32}$ representing the transmission signal from the second port of the device under test to the third port of the device under test;

$S_{13}$ representing the transmission signal from the third port of the device under test to the first port of the device under test;

$S_{23}$ representing the transmission signal from the third port of the device under test to the second port of the device under test; and, $S_{33}$ representing the reflective signal from the third port of the device under test to the third port of the device under test;

wherein $S_{21}=S_{12}$, $S_{13}=S_{31}$, and $S_{23}=S_{32}$.

16. A device tester that tests a device under test, the device tester comprising:

a communication port means for communicating to a calibration module in order to instruct the calibration module to change termination values at a port of the calibration module without physically disconnecting the port of the calibration module from a first port of the device under test;

a first port means for connecting to a second port of the device under test; and, a second port means for connecting to a third port of the device under test;

wherein the device tester obtains calibration parameters for the device under test.

17. A device tester as in claim 16 wherein the calibration parameters are three-port S-parameters.

18. A device tester as in claim 16 wherein:

the device under test is a power splitter;

the first port of the device under test is an input port of the power splitter; and, the second port and the third port of the device under test are output ports of the power splitter.

19. A device tester as in claim 16 wherein:

the device under test is a directional coupler;

the first port of the device under test is an output port of the directional coupler; and, the second port and the third port of the device under test are coupled ports of the directional coupler.

20. A device tester as in claim 16 wherein the calibration parameters are the following three-port S-parameters:

$S_{11}$ representing a reflective signal from the first port of the device under test to the first port of the device under test;

$S_{21}$ representing the transmission signal from the first port of the device under test to the second port of the device under test;

$S_{31}$ representing the transmission signal from the third port of the device under test to the first port of the device under test;

$S_{12}$ representing the transmission signal from the second port of the device under test to the first port of the device under test;

$S_{22}$ representing the reflective signal from the second port of the device under test to the second port of the device under test;

$S_{32}$ representing the transmission signal from the second port of the device under test to the third port of the device under test;

$S_{13}$ representing the transmission signal from the third port of the device under test to the first port of the device under test;

$S_{23}$ representing the transmission signal from the third port of the device under test to the second port of the device under test; and, $S_{33}$ representing the reflective signal from the third port of the device under test to the third port of the device under test;

wherein $S_{21}=S_{12}$, $S_{13}=S_{31}$, and $S_{23}=S_{32}$.

* * * * *

UNITED STATES PATENT AND TRADEMARK OFFICE
CERTIFICATE OF CORRECTION

PATENT NO. : 7,013,229 B2  Page 1 of 1
APPLICATION NO. : 10/712645
DATED : March 14, 2006
INVENTOR(S) : Wong et al.

It is certified that error appears in the above-identified patent and that said Letters Patent is hereby corrected as shown below:

On the face page, in field (56), under "Other Publications", in column 1, line 3, delete "vol." and insert - - Vol. - -, therefor.
On the face page, in field (56), under "Other Publications", in column 1, line 4, delete "pp582-586." and insert - - pp. 582-586. - -, therefor.
On the face page, in field (56), under "Other Publications", in column 2, line 3, delete "vol." and insert - - Vol. - -, therefor.
On the face page, in field (56), under "Other Publications", in column 2, line 3, delete "pp" and insert - - pp. - -, therefor.
On the face page, in field (56), under "Other Publications", in column 2, line 7, delete "vol." and insert - - Vol. - -, therefor.
On the face page, in field (56), under "Other Publications", in column 2, line 8, delete "pp" and insert - - pp. - -, therefor.
On the face page, in field (56), under "Other Publications", in column 2, line 12, delete "pp" and insert - - pp. - -, therefor.
On the face page, in field (56), under "Other Publications", in column 2, line 16, delete "pp" and insert - - pp. - -, therefor.
On the face page, in field (56), under "Other Publications", in column 2, line 19, delete "vol." and insert - - Vol. - -, therefor.
On the face page, in field (56), under "Other Publications", in column 2, line 24, delete "vol." and insert - - Vol. - -, therefor.

Signed and Sealed this

Twenty-second Day of August, 2006

JON W. DUDAS
*Director of the United States Patent and Trademark Office*